US005790154A

United States Patent [19]

Mitani et al.

[11] Patent Number: 5,790,154

[45] Date of Patent: Aug. 4, 1998

[54] METHOD OF MANUFACTURING AN INK EJECTION RECORDING HEAD AND A RECORDING APPARATUS USING THE RECORDING HEAD

[75] Inventors: Masao Mitani; Kenji Yamada; Osamu Machida, all of Hitachinaka, Japan

[73] Assignee: Hitachi Koki Co., Ltd., Tokyo, Japan

[21] Appl. No.: 761,900

[22] Filed: Dec. 9, 1996

[30] Foreign Application Priority Data

Dec. 8, 1995 [JP] Japan .................................... 7-320446
Jun. 28, 1996 [JP] Japan .................................... 8-169073

[51] Int. Cl.$^6$ ............................ B41J 2/05; H01C 1/012; H01L 29/00

[52] U.S. Cl. ............................ 347/59; 347/65; 338/308; 257/537

[58] Field of Search ................................ 347/59, 60, 62, 347/65; 437/918; 338/308, 309; 257/537

[56] References Cited

U.S. PATENT DOCUMENTS

| | | | |
|---|---|---|---|
| 4,429,321 | 1/1984 | Matsumoto | 347/60 |
| 4,862,197 | 8/1989 | Stoffel | 347/60 |
| 5,045,870 | 9/1991 | Lamey et al. | 338/308 |
| 5,081,473 | 1/1992 | Hawkins et al. | 338/320 |
| 5,081,474 | 1/1992 | Shibata et al. | 347/60 |
| 5,122,812 | 6/1992 | Hess et al. | 347/59 |
| 5,478,606 | 12/1995 | Ohkuma et al. | 427/555 |
| 5,666,140 | 9/1997 | Mitani et al. | 347/59 |

FOREIGN PATENT DOCUMENTS

| | | |
|---|---|---|
| 48-9622 | 2/1973 | Japan . |
| 54-51837 | 4/1979 | Japan . |
| 671888 | 3/1994 | Japan . |
| 6238901 | 8/1994 | Japan . |
| 6297714 | 10/1994 | Japan . |
| 8238771 | 9/1996 | Japan . |

OTHER PUBLICATIONS

Nikkei Mechanical, Dec. 28, 1992, pp. 58–63.

*Primary Examiner*—Peter S. Wong
*Assistant Examiner*—Bao Q. Vu
*Attorney, Agent, or Firm*—Whitham, Curtis & Whitham

[57] ABSTRACT

In an ink ejection recording head, a silicon dioxide layer is formed on the surface of a silicon substrate, a silicon nitride layer is formed on the silicon dioxide layer, and a plurality of heaters are formed on the silicon nitride layer. The heater is constituted by a thin film resistor made from a Ta—Si—O alloy and a thin film conductor made from nickel. Further, a gold layer is formed through plating on at least a portion of the thin film conductor to be connected to another conductor prior to thermally oxidizing the heaters.

18 Claims, 9 Drawing Sheets

METHOD OF MANUFACTURING AN INK EJECTION RECORDING HEAD AND A RECORDING APPARATUS USING THE RECORDING HEAD

BACKGROUND OF THE INVENTION

1. Field of the Invention

The present invention relates to a method of manufacturing an ink ejection recording head and a recording apparatus using the ink ejection recording head as manufactured.

2. Description of Related Art

Japanese Laid-Open Patent Publication (hereinafter referred to as OPI publication) Nos. SHO-48-9622 and SHO-54-51837 describe an ink jet recording device wherein a portion of ink in an ink chamber is rapidly vaporized to form an expanding bubble. The expansion of the bubble ejects an ink droplet from an orifice connected with the ink chamber.

As described in the August 1988 edition of Nikkai Mechanical (see page 58), the simplest method for rapidly heating the portion of the ink is by applying an energizing pulse of voltage to a heater. The heater described in the above-noted documents are constructed from a thin film resistor and thin film conductors covered with an anti-corrosion layer for protecting the resistor from corrosion damage. The anti-corrosion layer is additionally covered with one or two anti-cavitation layers for protecting the anti-corrosion layer against cavitation damage.

OPI publication No. HEI-6-71888 describes a protection-layerless heater formed from a Ta—Si—O alloy thin film resistor and nickel conductors. Absence of protection layers to the heater greatly improves efficiency of heat transmission from the heater to the ink. This allows great increases in print speed, i.e., in frequency at which ink droplets can be ejected. A print head wherein such heaters are used can be more simply produced.

Ink droplets can be ejected by applying only small amounts of energy to the heaters. The area surrounding the heaters will not be heated up by the small amount of energy applied. Therefore, the LSI chip for driving the heaters can be formed near the heaters without fear of the LSI being damaged by overheating. OPI publication Nos. HEI-6-238901 and HEI-6-297714 describe an on-demand head with a simple monolithic structure wherein the LSI chip for driving the heaters is positioned near the heaters. The print head has many nozzles arranged two dimensionally at a high density. Also, the number of control wires is greatly reduced.

Heretofore, the teachings of the above-described prior art has not been applied to a large scale high density integrated thermal ink jet print head as proposed in OPI publication No. HEI-6-297714.

SUMMARY OF THE INVENTION

An object of the present invention is to improve the property of a large scale high density integrated thermal ink jet print head.

Another object of the present invention is to decrease the number of steps in the manufacturing procedure of the ink jet print head.

Still another object of the present invention is to simplify the structure of the large scale high density integrated thermal ink jet print head of a monolithic structure.

To achieve the above and other objects, there is provided an ink ejection recording head which includes a silicon substrate having a first surface and a second surface opposite the first surface; a silicon dioxide layer formed on the first surface of the silicon substrate; a silicon nitride layer formed on the silicon dioxide layer; and a plurality of heaters formed on the silicon nitride layer. Each heater comprises a thin film resistor made from a Ta—Si—O alloy and a thin film conductor made from nickel. A driving unit is formed on the first surface of the silicon substrate and connected to the plurality of heaters for driving the plurality of heaters. An orifice plate is also provided which is formed with a plurality of nozzles from which ink droplets are ejected when the plurality of heaters are energized. The nozzles eject the ink droplets in a direction substantially perpendicular to the plurality of heaters. There are provided means for defining a plurality of individual ink channels formed on the first surface of the silicon substrate corresponding to respective ones of the plurality of nozzles individually, and means for defining a common ink channel formed on the first surface of the silicon substrate. The common ink channel is in fluid communication with the plurality of individual ink channels. An ink groove is formed on the first surface of the silicon substrate to be connected to the common ink channel, and an ink supply port is formed on the second surface of the silicon substrate. The ink groove is in fluid communication with the ink supply port.

Further, the plurality of heaters are formed by a heat oxidation by way of radiation heating. A bonding pad is formed on the first surface of the silicon substrate for connecting the driving unit to an external circuit. Metallization of the bonding pad is in a double-layer structure consisting of the thin film resistor made from the Ta—Si—O alloy and the thin film conductor made from nickel.

The thin film conductor of the bonding pad is subjected to plating to form a gold thin film layer. The the orifice plate is made from a photosensitive dry film.

According to another aspect of the present invention, there is provided a method of producing an ink jet recording head, which includes the steps of:

(a) forming a silicon dioxide layer on a surface of a silicon substrate;

(b) forming a silicon nitride layer on the silicon dioxide layer formed in step (a);

(c) forming a plurality of heaters on the silicon nitride layer, each of the plurality of heaters comprising a thin film resistor made from a Ta—Si—O alloy and a thin film conductor made from nickel;

(d) forming an ink groove on the surface of the silicon substrate while utilizing the silicon nitride layer as an anisotropic etching resist mask, the ink groove being in fluid communication with a common ink channel which in turn is in fluid communication with a plurality of individual ink channels.

Step (d) may further include a step of forming an aluminum layer on the surface of the silicon substrate and utilizing the aluminum layer as the anisotropic etching resist mask. An ink supply hole is further formed in another surface of the silicon substrate. This ink supply hole is in fluid communication with the ink groove. The ink supply hole is formed by forming a silicon nitride layer on the another surface of the silicon substrate and the silicon nitride layer is utilized as the anisotropic etching resist mask.

Preferably, a gold layer may further be formed through plating on at least a portion of the thin film conductor which portion is to be connected to another conductor. Thereafter, the plurality of heaters are thermally oxidized.

BRIEF DESCRIPTION OF THE DRAWINGS

The particular features and advantages of the invention as well as other objects will become more apparent from the following description taken in connection with the accompanying drawings, in which:

FIG. 3(*b*) is a plan view showing the nozzle plate of the overall head shown in FIG. 4;

FIG. 3(*c*) is a plan view showing the head with the orifice plate removed;

FIG. 3(*d*) is a plan view showing the head with the partition wall removed from FIG. 3(*c*);

DETAILED DESCRIPTION OF THE PREFERRED EMBODIMENTS

Figure 1:
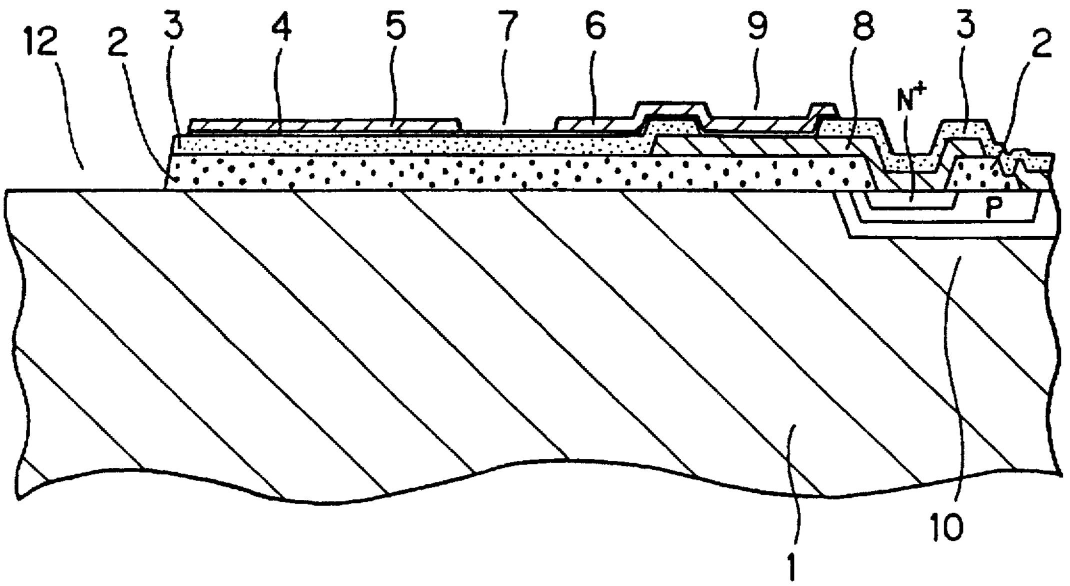
FIG. 1 is a cross-sectional view taken along line A—A of FIG. 7 and shows a vicinity of a thermal heater of a print head according to a first embodiment of the present invention.

A recording apparatus and method of producing an ink ejection recording head according to a first embodiment of the present invention will be described while referring to the accompanying drawings wherein like parts and components are designated by the same reference numerals to avoid duplicating description.

Figures 3A, 3B, 3C, 3D:
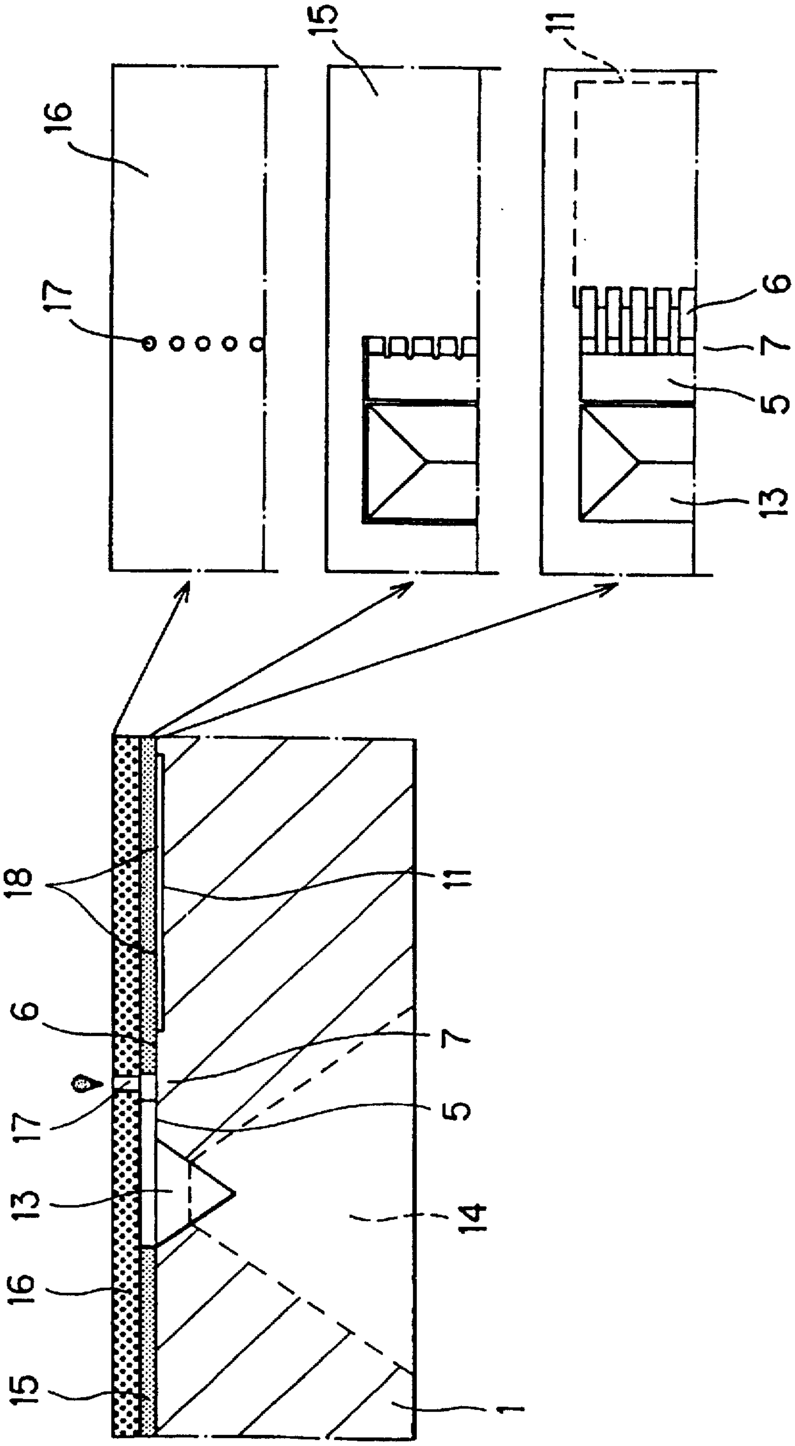
FIG. 3(*a*) is a cross-sectional view showing one nozzle of a row of nozzles in an ink jet recording head according to the first embodiment of the present invention.
Figure 4:
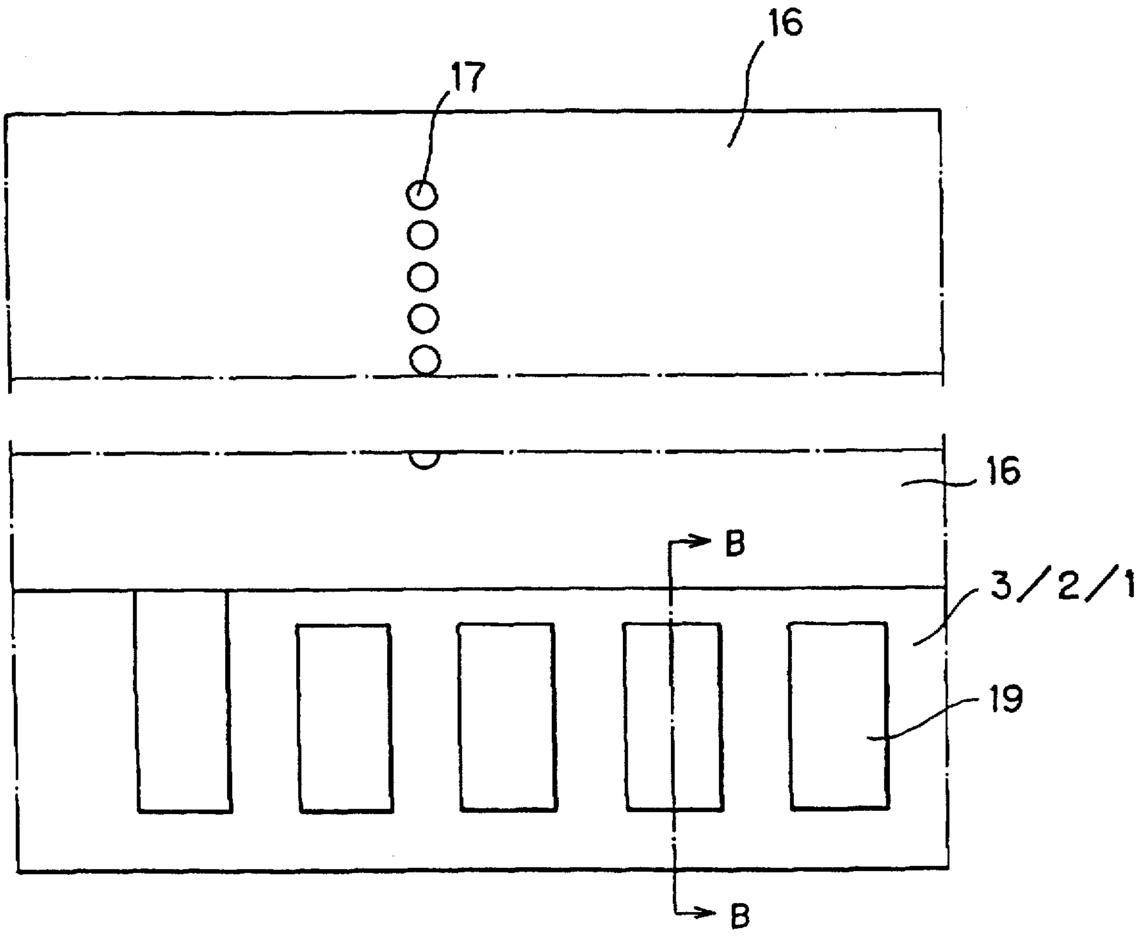
FIG. 4 is a plan view showing the nozzle plate of FIG. 3(*a*)

FIG. 3(*a*) is a cross-sectional view showing one nozzle of a row of nozzles in an ink jet recording head according to a preferred embodiment of the present invention. The ink jet recording head has a nozzle density of 400 dpi. FIG. 4 is a plan view showing the nozzle plate of FIG. 3(*a*). FIG. 3(*b*) is a plan view showing the nozzle plate 16 having orifices 17 of the overall head shown in FIG. 4. FIG. 3(*c*) is a plan view showing the head with the nozzle plate 16 removed revealing the partition wall 15. FIG. 3(*d*) is a plan view showing the head with the partition wall 15 removed from FIG. 3(*c*).

The thermal heater 7 is connected to a metal film common wiring conductor 5 and as individual wiring conductor 6. Each of the individual wiring conductors 6 are connected to a drive transistor 10 of a drive LSI 11. Although not shown in the drawings, shift resistors and latch circuits are also included in the drive LSI 11 and an connected to an LSI aluminum wiring conductor 18.

Bonding pads 19 shown in FIG. 4 are connected to the aluminum wiring conductor 18 and serve as terminal portions for inputting signal voltages from an external circuit. One of the bonding pads 19 is connected to ground common wiring conductor 5. The other bonding pads 19 are connected to the Al wiring conductor 18 covered by a silicon nitride passivation layer 8.

Ink supplied from an ink supply hole 14 fills an ink channel 13. The ink from the ink channel passes through a common ink channel formed above the common wiring conductor 5 and individual ink channels, each formed with a thermal heater therein. The ink is ejected from nozzles 17 in accordance with drive signals.

Figure 5:
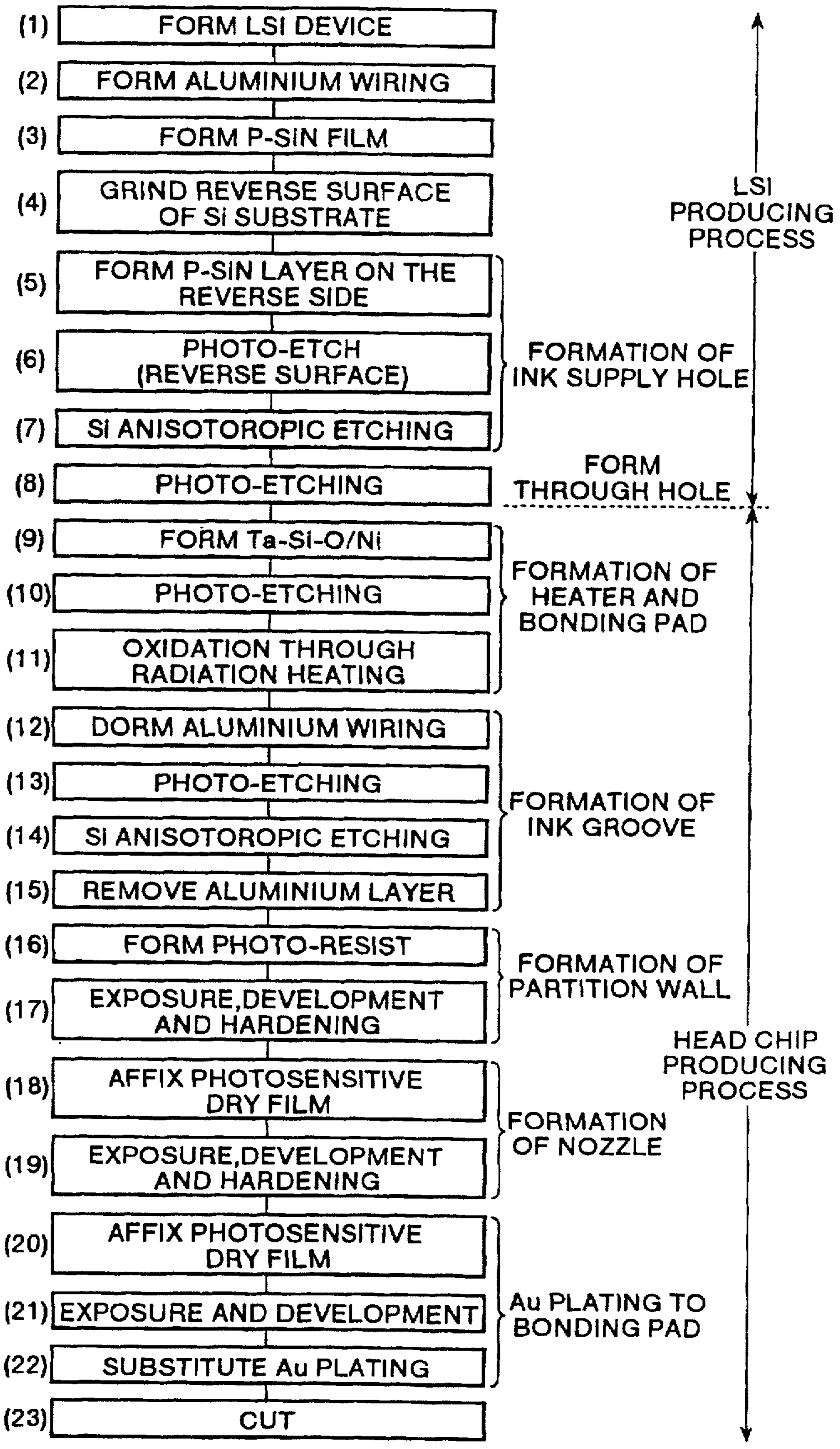
FIG. 5 is a process diagram schematically showing a process for producing a monolithic LSI head according to the first embodiment of the present invention.

An explanation for the production method of the head shown in FIGS. 3(*a*)–3(*d*) will be provided while referring to FIG. 5. Processes for producing the LSI device are almost all included in step (1). A CMOS, a BIP, a Bi-CMOS, and the like can be used for the LSI device. Half the ultimate thickness of the multi-layer $SiO_2$ layer 2 is formed during step (1).

Step (2) is the first wiring processes, which is the final process for the LSI device. During step (2), about 1 micron thick $SiO_2$ layer is superimposed, thereby completing the multi-layer $SiO_2$ layer 2.

Step (3) is a process for using plasma CVD techniques to form an approximately 1 micron thick silicon nitride layer 3 for protecting the aluminum wiring 18 formed in step (2) and the LSI device.

A normal LSI is completed in step (8) when a through hole for connecting the LSI to an external circuit is formed in the silicon nitride film. However, with the present invention, the rear surface of the silicon plate is polished in step (4). In step (5), an approximately 0.1 to 0.2 micron thick plasma silicon nitride thick film (not shown in the drawings) is formed on the rear surface of the silicon substrate. In step (6), a portion of the silicon nitride film corresponding to the ink supply hole 14 is removed by photo-etching. In step (7), the ink supply hole 14 is opened using anisotropic etching. However, anisotropic etching is stopped when the distance from the bottom of the ink supply hole 14 to the upper surface of the silicon substrate 1 is about 80 to 100 microns. As will be described in detail later, this is because a through hole is not formed in the surface of the silicon substrate 1 and in order so that the time of anisotropic etching for forming the ink channel 13 in step (14) can be reduced to about ⅕.

The first feature of the present invention is that the thin plasma silicon nitride film is used as an anisotropic etching mask for forming the ink supply hole 14. The reasons for this will be explained below.

The first reason is that plasma silicon nitride film can be used as a resist in both the 15% KOH aqueous solution used for the anisotropic etching liquid during step (7) and the hydrazine aqueous solution used in step (14). The 15% KOH aqueous solution is used in step (7) to achieve a faster etching speed and to obtain a clean etching shape. Hydrazine aqueous solution is used for the anisotropic etching liquid in step (14) because of selective etching (to be described later). The second reason is that the plasma silicon nitride film can be formed in an even layer without defective areas. The third reason is that plasma silicon nitride film is easy to use during processes for producing the LSI device. Further, the rear surface of the silicon substrate is a flat polished surface. Even is defects such as pin holes exist in the polished surface, etching will not progress to a depth equal to or greater than the size of pin holes because of the nature of anisotropic etching performed with respect to a (100) silicon substrate 1. A thin plasma silicon nitride film suffices. These all are important conditions for reducing the costs of the head.

Figure 6:
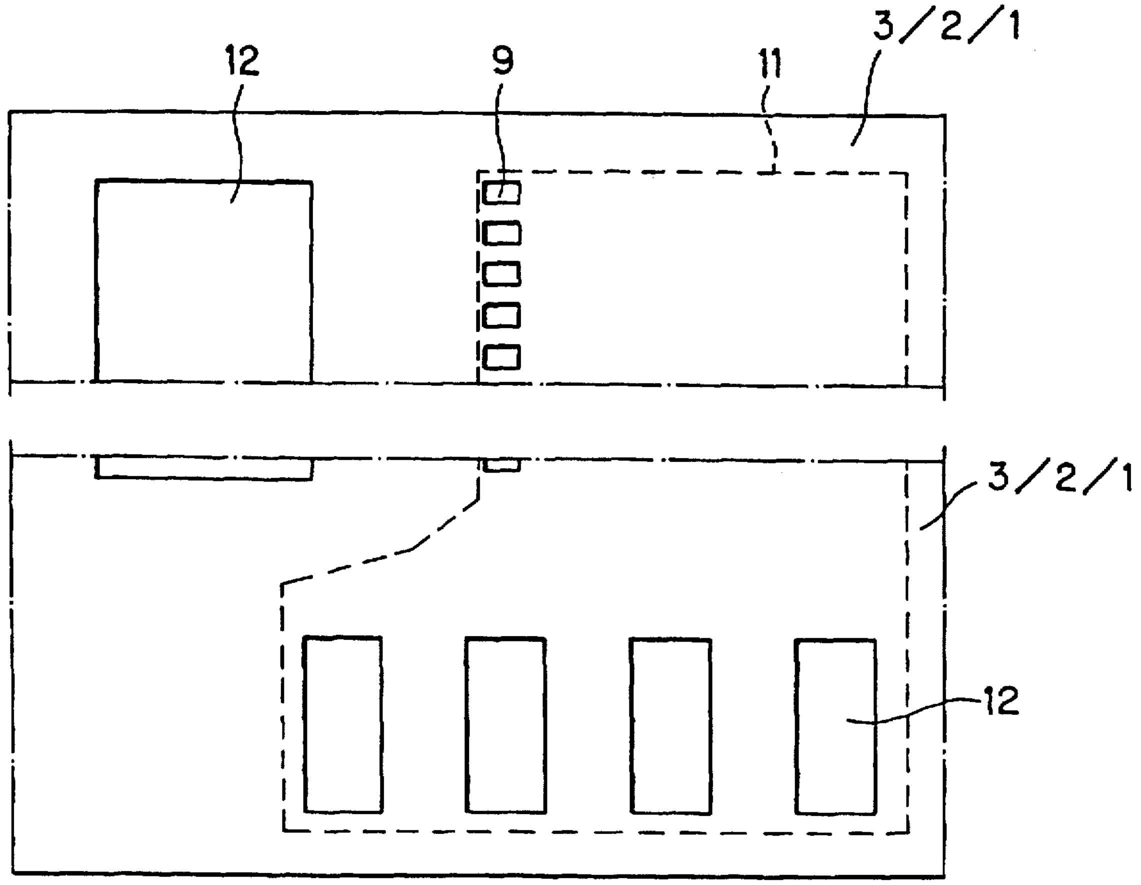
FIG. 6 is a plan view showing a substrate after being photo-etched by a step (8) of the process shown in FIG. 5.

The plasma silicon nitride film 3 formed in step (3) is photo-etched in step (8) to open up areas intended to become, as shown in FIG. 6, through holes 9 for connecting the individual wiring conductors 6, through holes 21 for connecting an external circuit, and an ink groove portion 12 intended to be the ink groove. Of these, the bottom surface of ink groove portion 12 is an approximately 2 micron thick $SiO_2$ layer. Therefore, as shown in FIG. 1, the heater portion of the silicon substrate will be exposed by removing this $SiO_2$ layer also.

In step (9), an approximately 0.1 micron thick Ta—Si—O alloy thin film resistor and an approximately 1.0 micron thick nickel thin film conductor are formed on the substrate shown in FIG. 6 using sputtering techniques. It should be noted that the substrate shown in FIG. 6 is actually formed by two-dimensionally aligning two or more silicon wafers.

Next, in step (10), the common wiring conductor 5, the individual wiring conductor 6, the thermal heater 7, and the bonding pad 19 are formed by accumulation and photoetching.

Figure 7:
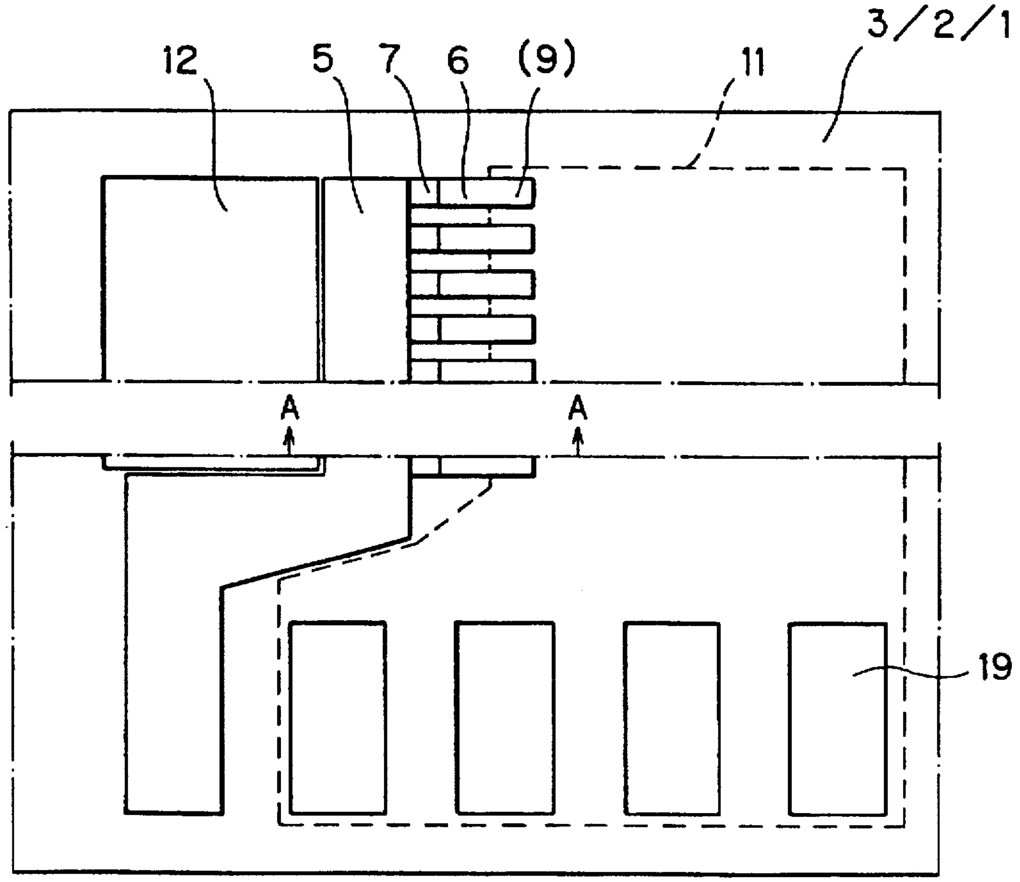
FIG. 7 is a plan view showing a substrate after being photo-etched by a step (11) of the process shown in FIG. 5.
Figure 8A:
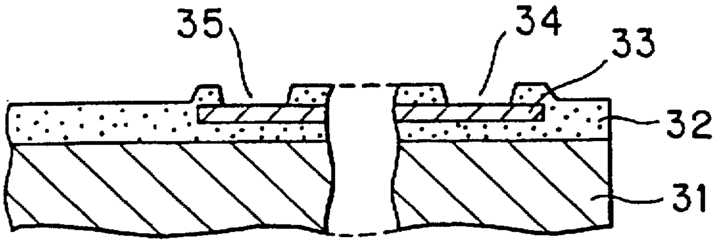
FIGS. 8(*a*) through 8(*e*) are cross-sectional views of a heater substrate for describing a head producing process according to a second embodiment of the present invention.
Figure 8B:
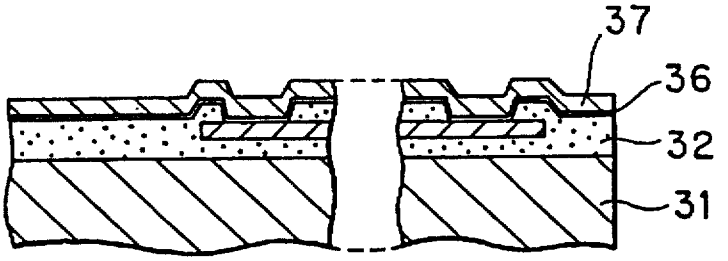
Figure 8C:
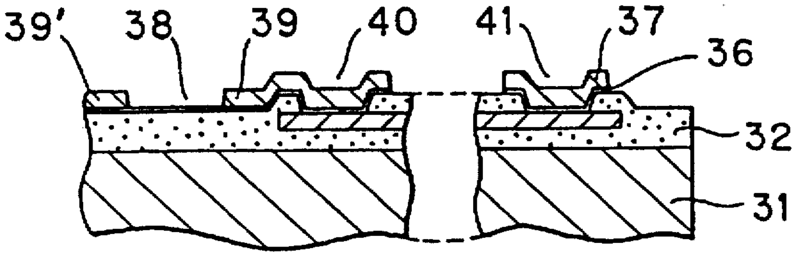
Figure 8D:
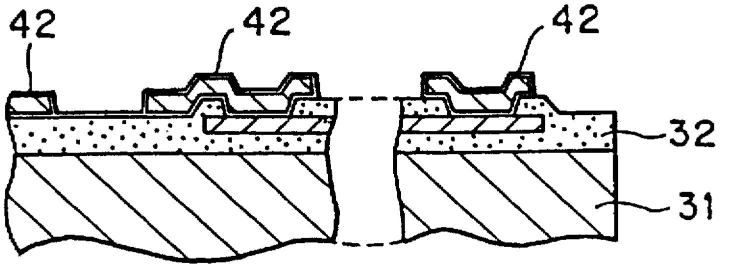
Figure 8E:
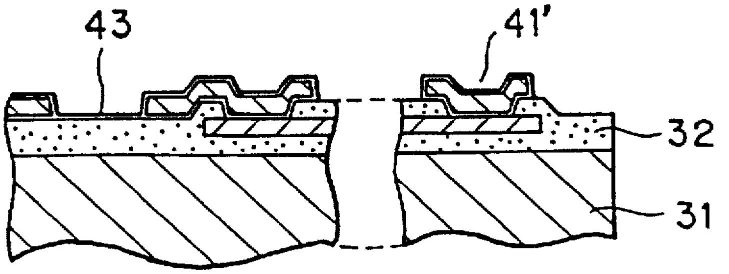

FIG. 7 shows the configuration resulting from step (10). As shown in FIG. 1, an approximately 2 micron thick $SiO_2$ layer and an approximately 1 micron thick silicon nitride thick layer 3 are evenly formed to cover portions of the silicon substrate 1 not formed with the drive LSI 11 and the aluminum wiring portion. It should be noted that only the drive transistor portion 10 can be seen in FIG. 1. The thermal heater 7 is formed on top of this. This is the second feature of the present invention.

In conventional thermal heaters, a thermal insulation layer, usually formed from a $SiO_2$ layer, is formed on top of the silicon substrate. A thermal heater is formed on the thermal insulation layer and several protective layers are formed on top of the thermal heater. However, according to the present invention, a protection-layerless thermal heater is formed on the $SiO_2$ thermal insulation layer. By forming a silicon nitride film, which has a large thermal transmission rate, between the $SiO_2$ thermal insulation layer and the thermal heater, the silicon nitride film greatly reduces thermal insulation performance.

However, according to the present invention, a head is formed on top of the driver LSI. An approximately 2 micron thick $SiO_2$ layer is formed on the portion of the silicon substrate corresponding to the thermal heater. Further an approximately 1 micron thick silicon nitride film is formed on top of the $SiO_2$ layer. Therefore, the conventional $SiO_2$ layer in the position corresponding to the thermal heater is removed by photo-etching. It is necessary to remove a silicon nitride layer with an area one-size larger than the row of thermal heaters 7. This completely prevents the possibility of stepping of the Ta—Si—O/Ni 2-layer configuration thin film wiring.

The configuration that includes the silicon nitride film as shown in FIG. 1 was evaluated to determine the energy required to generate a vapor bubble. It was determined that application of a 1 microsecond pulse of 3.3W/50 microns$^2$, which is 10% more than the regular value, showed very little influence because no protective layers, other than an extremely thin oxidation layer of 100 Å or less, are formed on the thermal heater and because the pulse width of the applied voltage was a very short 1 to 2 microseconds.

Figure 2:
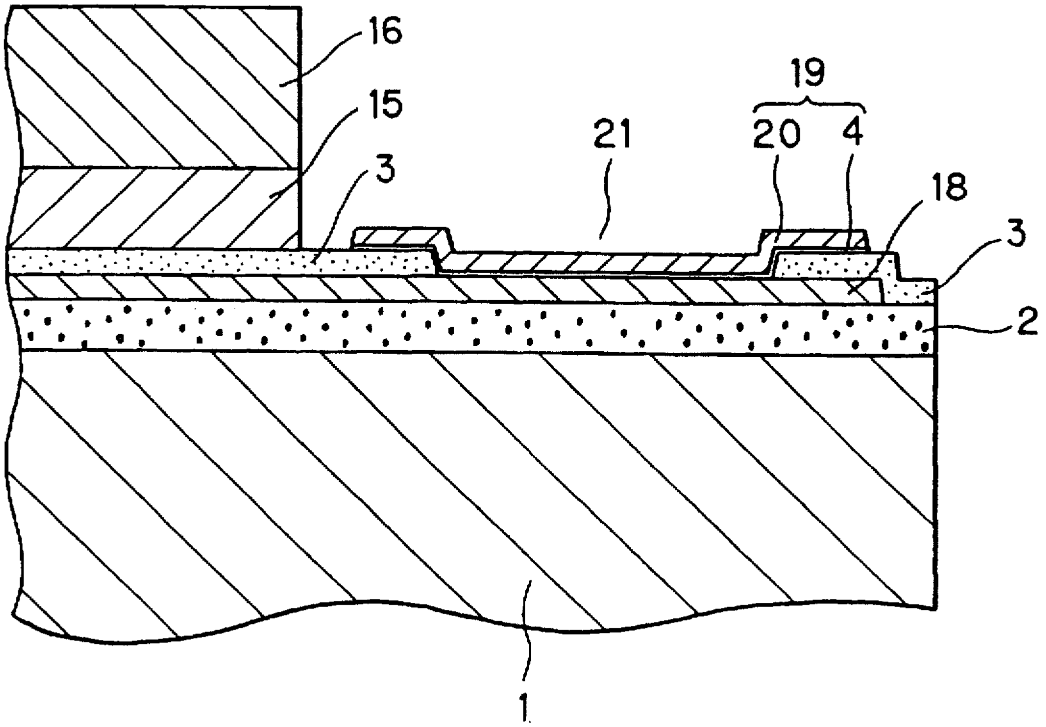
FIG. 2 is a cross-sectional view taken along line B—B of FIG. 4 and shows the vicinity of bonding pads of the print head according to the first embodiment of the present invention.

The third feature is that anti-corrosion metalization for the bonding pad portion 19 is simultaneously formed in step (10) so that the separate step required in conventional processes can be dispensed with. As shown in FIGS. 2 and 4, the aluminum thin film 18 that can be seen through the through hole 21 is completely protected by the Ta—Si—O/Ni two-layer configuration metallization 19, which has excellent anti-corrosion properties.

The radiant heat oxidation process of step (11) is the fourth feature of the present invention. An extremely thin insulation film having excellent anti-cavitation properties can be formed by high-temperature oxidation on the surface of the Ta—Si—O alloy thin film heater 4 used in the present invention. This technique is discussed in Non-laid Open Japanese Patent Application No. HEI-7-43968. The thermal heater must be heated to 500 degrees centigrade or more to perform this oxidation. However, the driver LSI formed on the same substrate can only be heated up to about 400 degrees centigrade. Therefore, the thermal heater 7 only is heated up to 500 to 600 degrees centigrade by applying pulses of voltage to it in an acid environment. However, this required probing and energizing during the production process and so forth showed potential for further streamlining of the production process. The radiant heat oxidation process of step (11) greatly simplified the production process and also increased yield of head production.

As shown in FIG. 7, the wafer is fixed on a radiation plate. The surface of the wafer is irradiated with infrared radiation. Therefore, even if the thermal heater 7 is heated to 600 to 700 degrees centigrade, the nickel conductor portions 5, 6, and 19 will heat up to only about 60 to 70 degrees centigrade. The aluminum wiring portion is the portion of the LSI device region 11 most sensitive to temperature. However, this portion will heat up only by the same amount as the nickel conductor portion. This is because the material forming the thermal heater 7, that is, Ta—Si—O alloy thin film heater, has a coefficient for absorbing infrared region light several times higher than does nickel or aluminum. Therefore, the film can be formed one fifth to one tenth the thickness.

Probing required for conventional pulse energizing heating process always results in some damage to the surface of the nickel thin film of the bonding pad 19. This reduces yield of head production. However, the present invention overcomes this problem. The thermal heater 7 formed by radiant heating oxidation processes indicates more stable anti-corrosion and anti-galvanization properties that do those formed using conventional methods. It is also an improvement over severe acid treatments performed by pulse heating.

The fifth feature of the present invention is in step (12) through step (15) for forming the ink grooves. After the radiant heat oxidation process of step (11), in step (12) an approximately 2 micron thick layer of aluminum is formed by sputtering over the entire surface of the wafer. Then in step (13), the aluminum thin film of the ink channel forming portion 12 is removed by photo-etching. The reason the aluminum thin film is intentionally used is that by using silicon anisotropic etching liquid and furthermore even by using hydrazine aqueous solution, which has the slowest etching rate for nickel thin film, the nickel thick film will be etched at a speed of 0.1 to 0.2 microns per hour. Therefore, by being covered with the aluminum layer, the nickel thin film can be protected from being etched during the approximately one hour required to form the ink channel. That is, the aluminum thin film is the most appropriate mask material for protecting the substrate, including the heater, from attack by the silicon anisotropic etching liquid, and by its own peeling liquid and etching liquid. Anisotropic etching is performed from both sides of the silicon substrate 1 at once by the hydrazine aqueous liquid. The ink channel 13 can be formed and the ink supply hole 14 can be completed effectively and in a short time at the same time. It should be noted that the ink supply hole 14 is already completed to about 90% of its total depth by the anisotropic etching process in step (7). This simultaneous etching can be performed after many other processes have been performed without performing an added resist process on the under surface of the silicon substrate 1 because P—SiN film is used as the resist material on the under surface of the silicon substrate 1 in step (5). This was discussed above during explanation of the first feature of the present invention.

Afterward, the ink channel 13 and the connection hole are completed by removing the aluminum film using a resist developing liquid NMD3 aqueous solution by Tokyo Ohka Kogyo Co., Ltd. This method slightly increases the number of processes. However, this method is necessary when it is desired to formed the nickel thin film conductors 5,6 to a thickness of only about 0.5 microns. It should be noted that it is desirable to form the nickel thin film conductors 5,6 thinly when the nozzles 17 are to be aligned at a high density of, for example, 800 dpi.

The partition walls 15 forming the individual ink channels and the common ink channel are formed in step (17) using the conventional method of exposing, developing, and hardening a photosensitive resist coated on the substrate or a photosensitive dry film adhered to the substrate.

The nozzles 17 are formed after attaching the orifice plate 16. According to the present invention, the nozzles 17 are formed by adhering a photosensitive dry film to the orifice plate 16 in step (18) and exposing, developing, and hardening in step (19). This is the sixth feature of the present invention.

The conventional method for forming nozzles includes adhering a polyimide film using an epoxy adhesive layer, then hardening the two-layer film and etching holes in the two-layer film using photoetching. The thickness of the two-layer-structure film determines about 70% of ejected ink volume. Therefore, the film needs to be 50 to 60 microns thick to form a 400 dpi head wherein the nozzles have a diameter of about 45 microns. Because nozzles will require two to three hours to form even when efficiently produced in an ECR type reactive dry etching device. It is desirable to improve production of this step.

Presently, holes for nozzles 17 can be formed to a diameter of about 1.5 to 2.0 times the thickness of the film layer of photosensitive dry film, which is the method with the highest resolution. Accordingly, the film needs to be about 20 to 30 microns thick for forming approximately 45 micron diameter holes required for a 400 dpi head. The amount of ejected ink will be much too little. Therefore, the method of using two to three layers of photosensitive dry film was developed. Each layer is adhered and exposed separately. However, all layers are developed, dried, post-exposed, and post-heated at the same time. This method increases the number of processes, but greatly increases production and reduces costs. Because, resolution of print heads is improving with progress of technology, single layers may be possible in the near future. The photosensitive dry film used in a 25 micron thick layer of photo-etch SR300EB from Hitachi Chemical Co., Ltd.

Silver plating processes for the bonding pads are performed in steps (20) to (22). Then clean cutting processes are performed in step (23). These are the seventh feature of the present invention. After the nozzles 17 are formed in the orifice plate 16, a photosensitive dry film, such as Phototech PHT-887AF-25 from Hitachi Chemical Co. Ltd. is adhered in step (20). Exposure and development are performed to seal with this film all areas except the bonding pad portion and the portion to be cut. When the under surface of the substrate is sealed by replacement metal plating processes in step (22), the nickel surface of the bonding pad 19 is silver plated to a thickness of about 0.1 microns. Non-cyan type replacement silver plating liquid HGS-100 from Hitachi Chemical Co., Ltd. can be used during the replacement silver plating. These processes can greatly increase reliability and yield of connection processes.

Further, because the cutting process of step (23) can be performed while the nozzles are still sealed with the dry film, dust generated during the cutting process can be completely prevented from entering the nozzles. The dry film can be easily removed using 4% KOH aqueous solution without damaging the head.

When producing a head with density of 400 dpi, 50 to 100 thousand nozzles, or about 100 full color heads with 128 nozzles in each of four rows, can be formed all at once in a five inch wafer. Production yield can be improved and ejection characteristics can be more stable. This head shows proper printing operation at an ejection speed of 5 to 10 KHz. Each nozzle was able to eject one hundred million dots or more without showing any defects. However, by providing the silicon nitride passivation layer on the $SiO_2$ layer, thermal efficiency drops by about 10%, which requires a print power increase of 10%. However, the print energy required is still one fourth to one fifth that required for conventional thermal heaters having thick protective layers.

The Ta—Si—O/Ni 2-layer metallization of the bonding pads 19 showed no defects even during high temperature load tests and so is far more reliable than conventional configurations. No degradation in solder connection could be observed in a head produced using the replacement metal plating process and set aside for several months. Nickel pads not formed using replacement metal plating processes showing defects in solder connection when set aside for only one or two weeks.

The seven features of the first embodiment are summarized below.

1. Formation of the thermal heater on a P—SiN film.
2. Radiant heat oxidation process of the thermal heater.
3. Ta—Si—O/Ni two-layer structure metallization of the bonding pads.
4. Replacement silver plating of the nickel thin film and the method of performing the plating.
5. Use of an aluminum thin film as a mask material for silicon anisotropic etching.
6. Use of a P—SiN thin film as a mask material for silicon anisotropic etching.
7. Formation of the orifice plate using a photosensitive dry film.

All of these features contribute greatly to eliminating steps from and streamlining the production process, and increasing yield. Features 2 and 3 improve reliability and stability of the head. A head formed using the process according to the present invention showed extremely stable ink ejection characteristics and properly ejected 100 million dots or more at an ejection speed of 5 to 10 kHz.

A second embodiment of the present invention will be described while referring to FIGS. 8(*a*)–8(*e*) and 9. The second embodiment is an improvement of the first embodiment. According to the first embodiment, a thin film oxidation insulation film excellent in anti-cavitation can be formed on the surface of the Ta—Si—O alloy through heat oxidation of the latter. The Ta—Si—O alloy must be heated up to more than 350° C. to perform the heat oxidation. However, during heating, the surface of the nickel thin film conductor including a portion to be connected to an external circuit is also thermally oxidized and thus electrically insulated. Therefore, it is necessary to remove the insulation layer through dry photo-etching in order to electrically connect the external circuit to the nickel thin film conductor. In the second embodiment, the surface oxidation of the nickel thin film electrode is prevented.

First, about 2 micron thick $SiO_2$ thermal insulation layer 32 is formed on the surface of a silicon (Si) substrate 31. The $SiO_2$ thermal insulation layer 32 may be formed either by thermally oxidizing the surface of the silicon substrate 31 or by utilizing the $SiO_2$ layer 32 of a multi-layer structure. In the latter case, about 1 micron thick silicon nitride layer 33 is formed on the $SiO_2$ layer 32 by a plasma chemical vapor deposition (CVD). this silicon nitride layer serves as a passivation layer. This two-layer structure of $SiO_2/Si_3N_4$ may be used as the thermal insulation layer 32.

A driver circuit formed for a head structure will be described.

First, openings 34 and 35 are formed in the $SiO_2$ layer 32 to the $Si_3N_4$ layer 33. Then, as shown in FIG. 8(*b*), a Ta—Si—O thin film alloy 36 and a nickel thin film conductor layer 37 are sequentially formed by sputtering on the silicon substrate 31 on which the thermal insulation layer 32 is formed. Thereafter, heat generating resistors 38 and bonding pads 19 are formed by photo-etching as shown in FIG. 8(*b*).

The heat generating resistors 38 and the conductor layer 37 have a thickness of about 0.1 micron and 0.5 micron, respectively. The heat generating resistor 38 is a square shape whose one side is 50 micron length. The resistance value of the heat generating resistor 38 is in a range from 80 to 250Ω. The composition ratio of the resistor 38 is determined to satisfy the following conditions.

$$64\% \leqq Ta \leqq 85\%$$

$$5\% \leqq Si \leqq 26\%$$

$$6\% \leqq O \leqq 15\%.$$

The Ta—Si—O alloy thin film 36 forms an insulating oxidation film of about 100 521 on its surface when it is subjected to thermal oxidation under more than 350° C. temperature. The insulating oxidation film thus formed is excellent in mechanical strength. The Ta—Si—O alloy thin film formed with the insulating oxidation film can stand a long term use in an electrolytic ink. In the second embodiment, in the step shown in FIG. 8(*c*), only the surface of the nickel thin film conductor is subjected to gold plating, whereby the thermal oxidation can be accomplished at one time. More specifically, the substrate shown in FIG. 8(*c*) is immersed into a substitution gold plating liquid to perform gold plating all over the surface of the nickel thin film conductor. By using HGS-100 produced by Hitachi Chemical Co., Ltd. as the substitution gold plating liquid, about 500 Å thick gold plating can be made only on the exposed surface of the nickel thin film conductor. The substrate is further immersed into a non-electrolytic gold plating liquid to grow the gold plating layer to a thickness of 1000 to 1500 Å or more. As the non-electrolytic gold plating liquid, HGS-2000 produced by Hitachi Chemical Co., Ltd. can be used.

The substitution gold plating layer is adhered only to the nickel surface, and the non-electrolytic gold plating is adhered only to the gold surface. Consequently, as shown in FIG. 8(*d*), the entire surface of the nickel thin film 37, 39, 39' are subjected to the gold plating as indicated by reference numeral 42 and no gold plating is performed on the surface of the thin film heater 38. The resultant substrate is thermally oxidized under about 400° C. temperature. Then, as shown in FIG. 8(*e*), the surface of the thin film heater 38 is covered with about 100 Å thick thermally oxidized insulation film 43. Therefore, the thin film elements formed on the surface of the substrate are covered with either a gold layer or a thermally oxidized insulation film.

The gold plating layer is formed to such a thickness in order that nickel does not diffuse into the gold plating layer during the thermal oxidation process at a temperature around 400° C.

Figure 9:
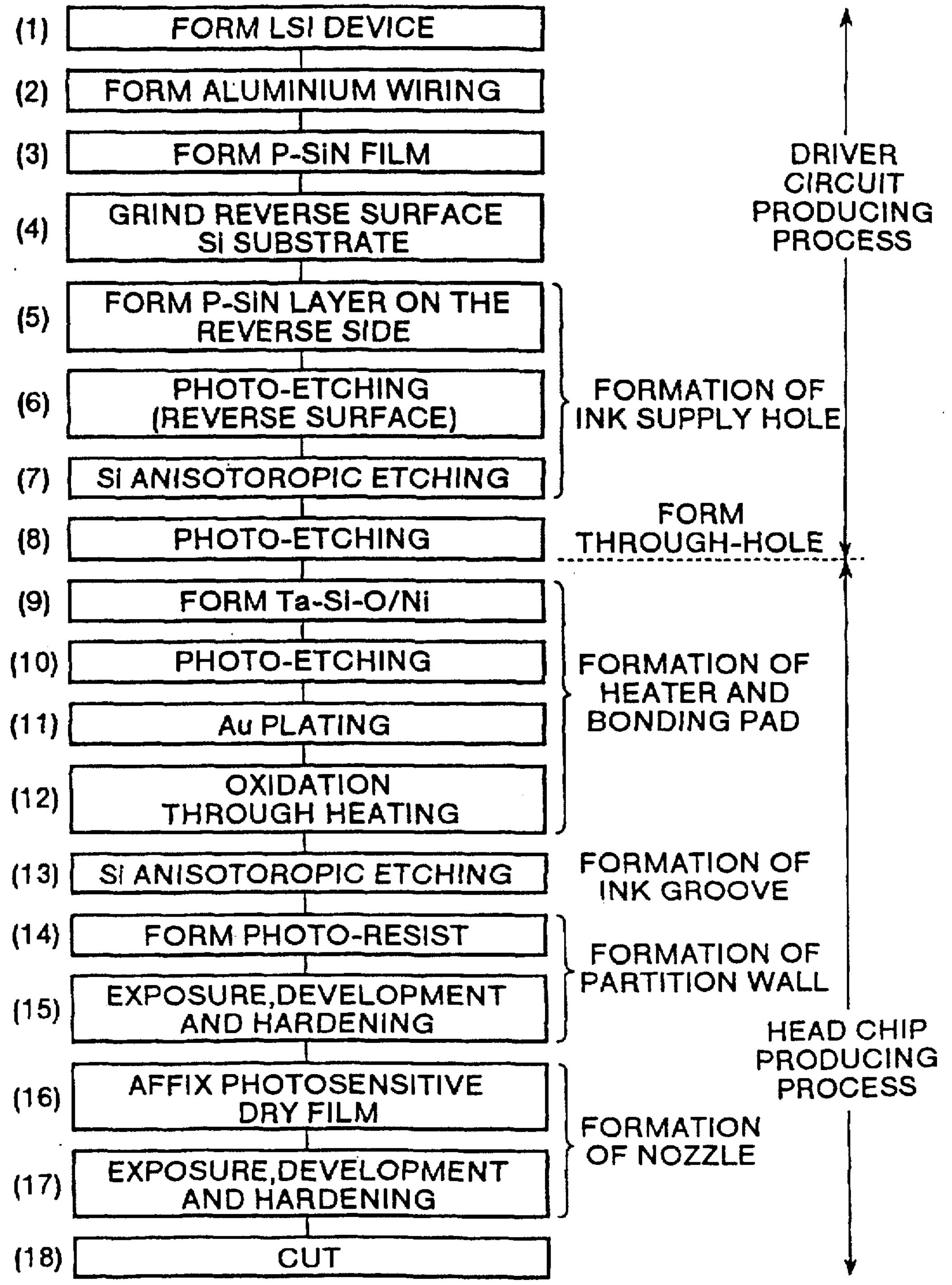
FIG. 9 is a process diagram schematically showing a process for producing a head according to the second embodiment of the present invention.

By way of a thin film process shown in FIG. 9, an ink jet device is formed on the heater substrate (silicon wafer substrate) formed as described above. FIG. 8(*a*) shows a part of the wafer cross-section when the step (8) in the process of FIG. 9 is completed. The thin film heater 38 and the bonding pad 41 are not provided in one-to-one correspondence but n-number of heaters are provided for about six bonding pads.

Performing the gold plating step immediately before the thermal oxidation process is advantageous in the following respects.

1. Thermal oxidation process for the heat generating resistors can be accomplished at one time.

2. The ink groove can be formed without aluminum coating. Conventionally, the nickel thin film was covered with the aluminum coating because the nickel thin film is soluble in hydrazine aqueous solution which is used for etching the ink groove. In accordance with the second embodiment of the present invention, the steps (12), (13) and (15) shown in FIG. 5 can be dispensed with by the gold plating process introduced by the second embodiment.

3. The step of plating the bonding pads with gold can be omitted because the bonding pads have already been plated with gold.

4. The resistance value of the nickel thin film conductor can be lowered to one half to one third of the conventional print head.

The head produced through the above-described process is used by filling a water-base ink in the ink chamber and printing is performed repeatedly. The head could stand more than one million times ejection of ink droplet and was still usable with no defect. Power required for ejecting the ink droplet was about 2 μJ/dot for 400 dpi nozzles. This value is about one tenth of the power conventionally required.

In view of the fact that the cost of gold plating increases in proportion to an area and thickness of the plating, the gold plating may not be performed except for the portion of the nickel thin film on which the bonding pad is provided. In this case, the non-plating area of the nickel thin film is covered with resist and plating is performed with respect only to the bonding pad portion. The common nickel thin film conductor may also be subjected to plating in order to reduce the line resistance.

Due to mutual diffusion of gold and nickel which may occur as a result of the thermal treatment, nickel may appear on the surface of the substitution gold plating layer. Therefore, the surface of the substitution gold plating layer tends to be oxidized and thus is rendered non-conductive. For this reason, non-electrolytic gold plating layer is superimposed on the substitution gold plating layer. It is required that the total thickness of the two layers be at least 1000 to 1500 Å. By so doing, the connecting operation with an external circuit can be facilitated and the reliability of the final product is enhanced. Simplifying the head producing process will improve the production yield of the head and thus the manufacturing cost can be reduced.

While the invention has been described in detail with reference to specific embodiments thereof, it would be apparent to those skilled in the art that various changes and modifications may be made therein without departing from the spirit of the invention, the scope of which is defined by the attached claims. For example, the heater according to the present invention is applicable to any type of thermal ink jet printer head regardless of whether it is of a top shooting type or a side shooting type.

What is claimed is:

1. An ink ejection recording head comprising:

a silicon substrate having a first surface and a second surface opposite the first surface;

a silicon dioxide layer formed on the first surface of said silicon substrate;

a silicon nitride layer formed on said silicon dioxide layer and providing an anisotropic etching resist mask for said silicon substrate;

a plurality of heaters formed on said silicon nitride layer, each of said plurality of heaters comprising a thin film resistor made from a Ta—Si—O alloy and a thin film conductor made from nickel;

a driving unit formed on the first surface of said silicon substrate and connected to said plurality of heaters for driving said plurality of heaters;

an orifice plate formed with a plurality of nozzles from which ink droplets are ejected when said plurality of heaters are energized, said plurality of nozzles ejecting the ink droplets in a direction substantially perpendicular to said plurality of heaters;

means for defining a plurality of individual ink channels formed on the first surface of said silicon substrate corresponding to respective ones of said plurality of nozzles individually; and means for defining a common ink channel formed on the first surface of said silicon substrate, said common ink channel being in fluid communication with said plurality of individual ink channels, wherein, while utilizing said silicon nitride layer as said anisotropic etching resist mask, an ink groove is formed on the first surface of said silicon substrate for connection to said common ink channel, and an ink supply port is formed on the second surface of said silicon substrate, said ink groove being in fluid communication with the ink supply port.

2. The ink ejection recording head according to claim 1, wherein said plurality of heaters are formed by a heat oxidation by radiation heating.

3. The ink ejection recording head according to claim 1, wherein a bonding pad is formed on the first surface of said silicon substrate for connecting the driving unit to an external circuit, metallization of said bonding pad being in a double-layer structure including the thin film resistor made from said Ta—Si—O alloy and the thin film conductor made from nickel.

4. The ink ejection recording head according to claim 3, wherein the thin film conductor of said bonding pad is subjected to plating to form a gold thin film layer.

5. The ink ejection recording head according to claim 1, wherein said orifice plate is made from a photosensitive dry film.

6. A method of producing an ink jet recording head, comprising the steps of:

(a) forming a silicon dioxide layer on a surface of a silicon substrate;

(b) forming a silicon nitride layer on said silicon dioxide layer formed in step (a);

(c) forming a plurality of heaters on said silicon nitride layer, each of said plurality of heaters comprising a thin film resistor made from a Ta—Si—O alloy and a thin film conductor made from nickel; and (d) forming an ink groove on the surface of said silicon substrate while utilizing said silicon nitride layer as an anisotropic etching resist mask, the ink groove being in fluid communication with a common ink channel which in turn is in fluid communication with a plurality of individual ink channels.

7. The method according to claim 6, wherein step (d) further comprises a step of forming an aluminum layer on the surface of said silicon substrate and utilizing said aluminum layer as the anisotropic etching resist mask.

8. The method according to claim 7, further comprising the step of forming an ink supply hole in another surface of said silicon substrate, said ink supply hole being in fluid communication with said ink groove, wherein said ink supply hole is formed by forming a silicon nitride layer on said another surface of said silicon substrate and said silicon nitride layer is utilized as an anisotropic etching resist mask.

9. The method according to claim 7, further comprising the steps of forming a gold layer through plating on at lest a portion of said thin film conductor to be connected to another conductor, and thereafter thermally oxidizing said plurality of heaters.

10. The ink ejection recording head according to claim 1, wherein said second surface of said silicon substrate has a polished, substantially even surface, a silicon nitride thin film is formed on said second surface of said silicon substrate, and the ink supply port is formed on said second surface while utilizing the silicon nitride thin film as an anisotropic etching resist mask.

11. The ink ejection recording head according to claim 1, wherein said thermal heaters each comprise a protection-layerless thermal heater.

12. The ink ejection recording head according to claim 1, wherein said silicon dioxide layer and said silicon nitride layer form a thermal insulation layer comprising a multi-layer structure, said silicon nitride layer including a thick silicon nitride layer, further comprising a gold plating on each of said heaters, wherein only the surface of the thin film conductor made of nickel includes said gold plating.

13. The method according to claim 6, wherein an anti-corrosion metalization for a bonding pad portion is simultaneously formed with said step of forming a plurality of heaters.

14. The method according to claim 6, wherein said silicon substrate includes first and second surfaces facing first and second sides, said silicon dioxide layer being formed on said first surface of said silicon substrate.

15. The method according to claim 14, wherein anisotropic etching is performed from both said first and second sides of the silicon substrate such that an ink supply hole in fluid communication with said ink groove is formed.

16. The method according to claim 6, wherein said silicon substrate includes first and second surfaces, said surface of said silicon substrate on which said silicon dioxide layer is formed comprising said first surface, said second surface having a polished, substantially even surface, the method furhter comprising the step of forming an ink supply port on said second surface, said ink supply port being formed in fluid communication with said ink groove, wherein said ink supply hole is formed by forming a silicon nitride thin film on said second surface of said silicon substrate, and said silicon nitride thin film is utilized as an anisotropic etching resist mask.

17. The method according to claim 6, further comprising a step of gold plating a surface of said thin film conductor made from nickel, and a step of thermally oxidizing said heaters at a same time.

18. The method according to claim 6, further comprising a step of immersing said silicon substrate into a substitution gold plating to perform gold plating all over a surface of said thin film conductor; and thereafter immersing said silicon substrate into a non-electrolytic gold plating liquid, such that said substitution gold plating layer adheres only to a surface of said thin film conductor and the non-electrolytic gold plating adheres only to a gold surface of the substitution gold plating, such that an entire surface of the thin film conductor made from nickel is subjected to gold plating and no gold plating is performed on a surface of the thin film resistor.

* * * * *